United States Patent [19]
Hoinkis

[11] Patent Number: 6,146,517
[45] Date of Patent: Nov. 14, 2000

[54] INTEGRATED CIRCUITS WITH COPPER METALLIZATION FOR INTERCONNECTIONS

[75] Inventor: Mark D. Hoinkis, Fishkill, N.Y.

[73] Assignee: Infineon Technologies North America Corp., San Jose, Calif.

[21] Appl. No.: 09/315,091

[22] Filed: May 19, 1999

[51] Int. Cl.⁷ .................................................... C23C 28/02
[52] U.S. Cl. ......................... 205/186; 205/157; 205/123; 427/255.7; 427/255.36; 427/255.391; 438/653; 438/656; 438/687
[58] Field of Search ..................................... 205/186, 157, 205/123; 438/653, 656, 687; 427/255.36, 255.391, 255.7

[56] References Cited

U.S. PATENT DOCUMENTS

| | | | |
|---|---|---|---|
| 5,933,758 | 8/1999 | Jain | 438/687 |
| 6,015,749 | 1/2000 | Liu et al. | 438/628 |
| 6,037,258 | 3/2000 | Liu et al. | 438/687 |
| 6,043,149 | 3/2000 | Jun | 438/658 |
| 6,048,790 | 4/2000 | Iacoponi et al. | 438/643 |
| 6,054,378 | 4/2000 | Sakala et al. | 438/620 |
| 6,069,068 | 5/2000 | Rathore et al. | 438/628 |
| 6,077,780 | 6/2000 | Dubin | 438/687 |

*Primary Examiner*—Kathryn Gorgos
*Assistant Examiner*—Christopher M. Keehan
*Attorney, Agent, or Firm*—Stanton C. Braden

[57] ABSTRACT

An improved fill of high aspect ratio trenches by copper is obtained by first sputtering a thin nucleating film of copper deposited by physical vapor deposition, then depositing a thin seed layer of copper by chemical vapor deposition, and then completing the fill by electroplating. Stress migration of the fill is improved if the copper deposition is preceded by the deposition by CVD of a layer of titanium nitride either alone or preceded and/or followed by the deposition of tantalum by an ionized PVD source.

16 Claims, No Drawings

INTEGRATED CIRCUITS WITH COPPER METALLIZATION FOR INTERCONNECTIONS

FIELD OF INVENTION

This invention relates to integrated circuit devices, and more particularly, to technology for interconnecting discrete circuit components of a circuit to form an integrated circuit.

BACKGROUND OF THE INVENTION

As integrated circuits become denser by making the circuit components smaller and packing them closer, it becomes increasingly important to interconnect the circuit components into an integrated circuit by conductors of as low a resistance as practical. To this end, there is increasing interest in the use of copper as the metal of choice for providing such interconnections because of both favorable electrical properties and relatively low cost. Copper has proven of particular interest when used as the back-end-of-line metal to provide the final metal interconnection, particularly as part of a single or dual Damascene overlying the process. In this process a pattern of trenches is formed in an insulating layer overlying the chip in which were formed the circuit componenets to be interconnected. The pattern of trenches is then overfilled by depositing a copper layer over the surface of the insulating layer and the copper is then removed from the layer except where it has filled the pattern. The removal is typically done by chemical mechanical polishing (CMP). Generally it is necessary to work with trench patterns that comprise relatively narrow lines because of space considerations. To achieve high conductance (low resistance) in view of the use of narrow width trenches, it is desirable to make the trenches relatively deep.

Presently preferred technology for filling with copper trenches of a width of between 0.15 and 0.25 microns and a depth of about 0.3 to 0.4 microns involves a sequence of steps. These include first sputtering (physical vapor deposition) a barrier-glue liner layer over the walls of the trench to be filled, then sputtering thereover a seed layer of copper, and finally completing the filling by electroplating copper. However, technology of this kind has proven to be relatively ineffective for essentially complete copper fill of trenches of aspect ratios much higher than five or six.

The term "trench" is used herein to describe both an extended groove and a localized via a region that extends from the bottom of the groove to a localized connection to an underling conductive region, such as a region of the semiconductor chip or another conductive line.

The present invention seeks to provide technology that can provide a satisfactory copper fill of trenches with aspect ratios significantly higher than 5 or 6, such as 10 or 12.

Another problem with copper is the issue of reliability. In particular, it is important that the conductivity of the copper fill remain relatively constant over long periods of use and not suffer from an ill described as "stress migration", which results in a change, usually an increase, in the resistance of the fill. Again present technology still has room for improvement in this respect. The present invention as another feature improves reliability especially with reducing stress migration.

SUMMARY OF THE INVENTION

The present invention seeks to provide technology for copper filling trenches of high aspect ratios that both improves the fill of the trenches and its reliability, and in particular reduces the stress migration of the copper fill.

To this end, in one aspect the invention is based on discovering that a particular preliminary treatment of the substrate to form a barrier glue liner over the walls of the trench before any deposition of copper is useful in improving reliability, especially in reducing the stress migration effect. In particular, this liner should comprise a layer of titanium nitride, advantageously deposited by chemical vapor deposition (CVD) of a thickness between about 25 and 200 Angstroms. Additionally, the liner can include either below and/or above this titanium nitride layer, a tantalum-rich layer, of either tantalum or tantalum nitride, deposited by physical vapor deposition (PVD), advantageously using an ionized PVD source.

In another aspect, the invention relates to a deposition sequence that results in a more complete copper fill of a trench with high aspect ratios that would not be satisfactorily filled by standard prior art filling techniques.

In particular, I have found that the best copper-fill process for trenches that have a sub micron width, for example, less than about 0.2 microns with aspect ratios in excess of 5 or 6, such as between 10 and 12, includes deposition by CVD of a copper seed layer in thickness of less than about 1000 Angstroms and advantageously of between about 400–500 Angstroms. This is preferably preceded by flash deposition of copper in particular, by a sputtering or physical vapor deposition, of a layer in thickness also of less than about 1000 Angstroms, and advantageously between about 400–500 Angstroms. The preliminary PVD step is found to aid the nucleating of the later CVD copper film. The initial PVD flash deposition need not form a continuous film over the walls of the trench to be useful. The remainder of the fill for the trench can then be provided by electroplating the copper in standard fashion, for example, using an electroplating bath comprising copper sulphate ($CuSO_4$) and sulphuric acid ($H_2SO_4$).

Viewed from one aspect, the present invention is directed to a process for the deposition of copper in a trench comprising the steps of first coating the walls of the trench with a liner that includes a layer of thickness of between about 25 and 200 Angstroms of titanium nitride deposited by chemical vapor deposition, and then depositing the copper to fill the trench. The liner optionally may include a tantalum-rich layer.

Viewed from another aspect, the present invention is directed to a process for the deposition of copper in a trench for filling the trench comprising the steps of first depositing by chemical vapor deposition on the walls of the trench a seed layer of copper between about 200 and 1000 Angstroms thick and then filling the trench by electroplating copper.

Viewed from a more specific aspect, the present invention is directed to a process of filling a trench in an insulating layer over a silicon substrate for forming a low resistance connections. The process comprises the steps of: forming over the surface of the trench a liner including a layer of titanium nitride; forming a nucleating film over the liner by sputtering a flash layer of copper; forming a seed layer of copper over the nucleating film by chemical vapor deposition, and then filling the trench by electroplating copper.

The invention will be better understood from the following more detailed description.

DETAILED DESCRIPTION

As has been discussed above, in the past it has been the usual practice to begin the process of copper filling a narrow trench for interconnecting components of the integrated circuit by lining the walls of the trench with a barrier-glue layer, generally of tantalum and/or tantalum nitride. In one form, the novel copper filling process of the invention may be optionally used without the usual barrier glue-liner layer that is normally deposited initially to enhance the adherent properties of copper to the materials, typically one of various silicon compounds, that form the insulating layer in which the trench is formed, and to the doped silicon or other conductor to which the copper needs to form a low resistance ohmic connection.

However, I have investigated for use as the liner layer in connection with the problem of stress migration especially the following group of five choices: CVD TiN; CVD TiN/PVD Ta; PVD Ta/CVD TiN/PVD Ta; PVD TaN/PVD Ta; and PVD Ta. As indicated, some of these layers comprise multiple films usually involving both chemically vapor deposited films and physically vapor deposited films. Generally these layers were limited to a total thickness of less than 500 Angstroms on the sidewalls of the trench measured 0.4 microns below the surface of a trench that was less than 0.2 micron wide. Typically individual films were limited to thicknesses between about 50 to 400 Angstroms.

In particular, it was discovered that for reducing stress migration the inclusion in the liner layer of a film of chemically vapor deposited (CVD) TiN (titanium nitride) was important. Better results were obtained if there was also included by ionized physical vapor deposition (I-PVD) a tantalum-rich film. Best results were obtained when there was first deposited a I-PVD Ta-rich film, followed in turn by CVD TiN and I-PVD Ta-rich films. Advantageously, each of these depositions should be preceded by standard degassing and sputter cleaning steps. The total thickness of the seed liner layer advantageously is less than 500 Angstroms and the process should avoid deposition temperatures greater than about 500° C. so as to not affect the properties of the integrated circuit.

The tantalum-rich film can be either a film of tantalum and/or a film of tantalum nitride. If included, each typically should also be in the range of between about 50 to 400 Angstroms in thickness.

After the liner is formed, one can proceed with the copper filling. In accordance with another feature of the invention that relates to improved copper filling, particularly of trenches with aspect ratios of between 8 and 12, the copper filling sequence comprises chemical vapor deposition of a copper seed layer, preferably preceded by physical vapor deposition of a flash copper layer to aid nucleating the subsequent CVD copper seed layer. Both the copper flash layer and the copper seed layer are thin, advantageously each less than 1000 Angstroms in thickness. The filling is then completed by copper electroplating in standard fashion. Generally the electroplating is done with a copper sulphate and sulphuric acid bath but any comparable bath should be feasible. Generally the electroplating is used to overfill the trenches and the excess and the plating outside the trench is removed by planarizing the surface by chemical mechanical polishing, as is characteristic of Damascene processing.

What is claimed is:

1. A method for the deposition of copper to fill a trench in the surface of a semiconductive device and provide an interconnection pattern for an integrated circuit comprising the steps of:

first depositing over the walls of the trench to be filled a barrier layer by depositing in turn a tantalum-rich layer of at least 50 Angstroms thick, a titanium nitride layer of at least 50 Angstroms thick and a tantalum-rich layer of at least 50 Angstroms thick; and then filling the trench with copper.

2. The method of claim 1 in which the total thickness of the barrier layer is less than about 500 Angstroms thick.

3. The method of claim 1 in which the tantalum-rich layers are deposited by physical vapor deposition and the titanium nitride layer is deposited by chemical vapor deposition.

4. The method of claim 2 in which the tantalum-rich layers are deposited by physical vapor deposition and the titanium nitride layer is deposited by chemical vapor deposition.

5. The method of claim 1 in which each tantalum-rich layer is chosen from the group consisting of tantalum and tantalum nitride layers.

6. The method of claim 4 in which each tantalum-rich layer is chosen from the group consisting of tantalum and tantalum nitride layers.

7. The method of claim 1 in which the trench has a submicron width.

8. The method of claim 5 in which the trench has a submicron width.

9. The method of claim 7 in which trench is filled with copper after the deposition of the barrier layer by first depositing by physical vapor deposition over the barrier layer a flash layer of copper, and then depositing by chemical vapor deposition a second seed layer of copper, and then filling the trench with copper by electroplating.

10. The method of claim 9 in which the trench has an aspect ratio of between 10 and 12.

11. The method of claim 9 in which both the flash layer and the seed layer are between 400 and 500 Angstroms thick.

12. The method of claim 10 in which both the flash layer and the seed layer are between 400 and 500 Angstroms thick.

13. A method of filling a trench having an aspect ratio greater than six at the surface of a semiconductive device comprising the steps of:

forming a barrier layer over the walls of the trench, depositing by physical vapor deposition over the barrier layer a flash layer of copper less than 1000 Angstroms thick;

depositing by chemical vapor deposition over the flash copper layer a seed copper layer of less than 1000 Angstroms thick; and filling the trench with copper by electroplating.

14. The method of claim 13 in which at least one of the flash and seed copper layers is between 400 and 500 Angstroms thick.

15. The method of claim 14 in which both the flash and seed copper layers are between 400 and 500 Angstroms thick.

16. The method of claim 15 in which the barrier layer includes a layer of titanium nitride.

* * * * *